(12) United States Patent
Wang

(10) Patent No.: US 11,240,911 B2
(45) Date of Patent: Feb. 1, 2022

(54) FLEXIBLE SUBSTRATE AND METHOD FOR MANUFACTURING SAME, AND FLEXIBLE ELECTRONIC DEVICE

(71) Applicant: BOE Technology Group Co., Ltd., Beijing (CN)

(72) Inventor: Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 55 days.

(21) Appl. No.: 16/623,028

(22) PCT Filed: Feb. 21, 2019

(86) PCT No.: PCT/CN2019/075745
§ 371 (c)(1),
(2) Date: Dec. 16, 2019

(87) PCT Pub. No.: WO2019/227981
PCT Pub. Date: Dec. 5, 2019

(65) Prior Publication Data
US 2021/0153337 A1    May 20, 2021

(30) Foreign Application Priority Data

May 30, 2018  (CN) .......................... 201810540699.9

(51) Int. Cl.
*H05K 1/02* (2006.01)
*H01L 23/538* (2006.01)
(Continued)

(52) U.S. Cl.
CPC ......... *H05K 1/028* (2013.01); *H01L 23/5387* (2013.01); *H05K 1/0283* (2013.01); *H05K 1/118* (2013.01); *H05K 3/40* (2013.01)

(58) Field of Classification Search
CPC ...... H05K 1/028; H05K 1/0283; H05K 1/118; H01L 23/5387
See application file for complete search history.

(56) References Cited

U.S. PATENT DOCUMENTS 4,893,626 A * 1/1990 Henley .................. A61B 5/259
600/397
8,552,299 B2  10/2013 Rogers et al.
(Continued)

FOREIGN PATENT DOCUMENTS

CN  101371353 B   6/2011
CN  105047676 A  11/2015
(Continued)

OTHER PUBLICATIONS

International search report of PCT application No. PCT/CN2019/075745 dated Mar. 15, 2019.
(Continued)

*Primary Examiner* — Hoa C Nguyen
(74) *Attorney, Agent, or Firm* — Fay Sharpe LLP

(57) ABSTRACT

Disclosed are a flexible substrate and a method for manufacturing the same, and a flexible electronic device. The flexible substrate includes: a flexible base; a plurality of electronic components disposed on the flexible base, a first gap being formed between each two adjacent electronic components of the plurality of electronic components; and a plurality of metal lines, wherein at least one end of each of the metal lines is connected to the corresponding electronic component, at least a portion of the plurality of metal lines are disposed in the first gap, and a length of each metal line disposed in the first gap is greater than a width of the first gap in an extension direction of the metal line; wherein a first filling layer is disposed in the first gap to wrap the metal line disposed in the first gap.

20 Claims, 10 Drawing Sheets

(51) Int. Cl.
*H05K 1/11* (2006.01)
*H05K 3/40* (2006.01)

(56) References Cited

U.S. PATENT DOCUMENTS

| | | | |
|---|---|---|---|
| 9,450,125 | B2 | 9/2016 | Lee |
| 2010/0246144 | A1 | 9/2010 | Yamazaki et al. |
| 2012/0051005 | A1* | 3/2012 | Vanfleteren ......... H01L 23/3142 |
| | | | 361/749 |
| 2014/0299362 | A1* | 10/2014 | Park ..................... H05K 1/0283 |
| | | | 174/254 |
| 2016/0150641 | A1 | 5/2016 | Yoo |
| 2017/0040306 | A1* | 2/2017 | Kim ....................... H05K 1/181 |
| 2017/0149019 | A1* | 5/2017 | Smith .................. H01L 51/5221 |
| 2017/0200678 | A1 | 7/2017 | Zhang et al. |
| 2018/0283844 | A1* | 10/2018 | Kamakura ............... G01B 7/20 |

FOREIGN PATENT DOCUMENTS

| | | | |
|---|---|---|---|
| CN | 105161514 | A | 12/2015 |
| CN | 204885164 | U | 12/2015 |
| CN | 108766951 | A | 11/2018 |

OTHER PUBLICATIONS

First office action of Chinese application No. 201810540699.9 dated Mar. 25, 2019.
Second office action of Chinese application No. 201810540699.9 dated Aug. 28, 2019.
Examination report of Indian application No. 201927052695 dated Oct. 13, 2021.

* cited by examiner (a)
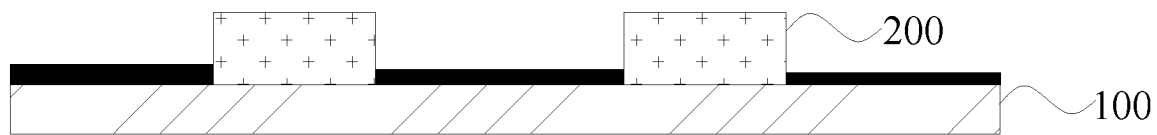
(b)
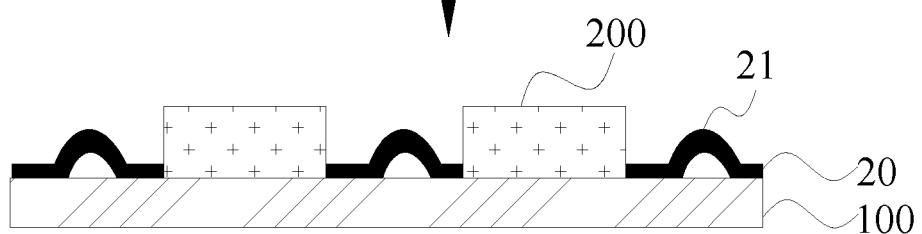
(c)
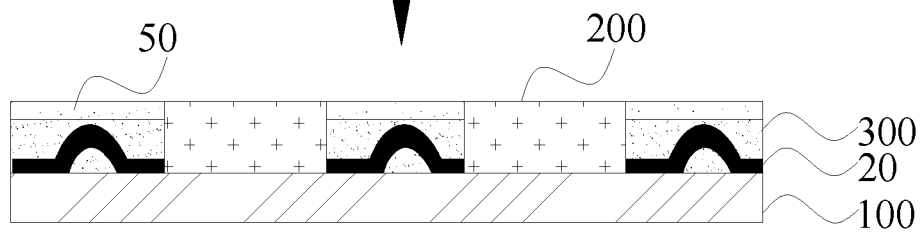
(d)
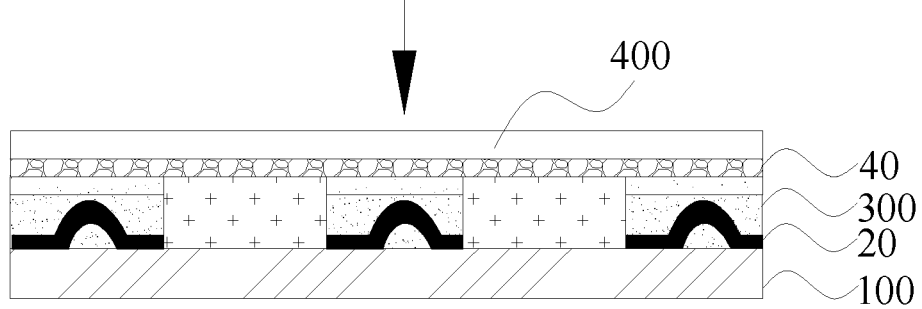
FIG. 9

FLEXIBLE SUBSTRATE AND METHOD FOR MANUFACTURING SAME, AND FLEXIBLE ELECTRONIC DEVICE

The present disclosure is a 371 of PCT Application No.: PCT/CN2019/075745 filed on Feb. 21, 2019, which claims priority to Chinese Patent Application No. 201810540699.9, filed on May 30, 2018 and entitled "FLEXIBLE SUBSTRATE AND METHOD FOR MANUFACTURING SAME, AND FLEXIBLE ELECTRONIC DEVICE", the entire contents of which are incorporated herein by reference.

TECHNICAL FIELD

Embodiments of the present disclosure relates to a flexible substrate and a method for manufacturing the same, and a flexible electronic device.

BACKGROUND

With the advancement of semiconductor process technologies, flexible electronic devices have also been greatly developed. The flexible electronic device realizes a curved (bendable) function of the electronic device mainly by integrating electronic components onto a flexible substrate. The flexible electronic device provides the basis for the implementation of devices such as a wearable electronic device, and a flexible display.

For the purpose of maintaining implementation of the functions of the electronic components during the process of bending the substrate, during manufacturing of the flexible electronic device, it is generally necessary to integrate and improve the structures of the electronic components integrated on the flexible substrate, the structures of connection lines, and the like, so as to ensure that the lines and electronic components, which are formed of metal or semiconductor materials, may not be damaged due to mechanical bending when the substrate is bent.

SUMMARY

In one aspect, an embodiment of the present disclosure provides a flexible substrate. The flexible substrate includes a flexible base; a plurality of electronic components disposed on the flexible base, a first gap being formed between each two adjacent electronic components of the plurality of electronic components; and a plurality of metal lines, wherein at least one end of each of the metal lines is connected to the corresponding electronic component, at least a portion of the plurality of metal lines are disposed in the first gap, and a length of each metal line disposed in the first gap is greater than a width of the gap in an extension direction of the metal line; wherein a first filling layer is disposed in the first gap to wrap the metal line disposed in the first gap.

According to the embodiment of the present disclosure, a material of the first filling layer includes a water gel having a Young's modulus of being less than 0.1 MPa.

According to the embodiment of the present disclosure, a material of the first filling layer includes a polymer material having a viscosity of being less than 10,000 cps.

According to the embodiment of the present disclosure, the plurality of electronic components are a plurality of flexible packages arranged in an array, and two ends of each of the metal lines are connected to the corresponding electronic component adjacent thereto.

According to the embodiment of the present disclosure, each metal line has protrusions in a direction perpendicular to the flexible base, and the first filling layer is higher than the protrusions on the metal line.

According to the embodiment of the present disclosure, the flexible substrate further includes a protective cover, wherein the protective cover is disposed on one side of the electronic component distal from the flexible base by an adhesive layer, and a second gap is formed between the first filling layer and the adhesive layer.

According to the embodiment of the present disclosure, the second gap is an air gap.

According to the embodiment of the present disclosure, the flexible substrate further includes a second filling layer disposed in the second gap, wherein a material of the second filling layer includes a material having a Young's modulus of being less than 0.1 MPa or a viscosity of being less than 10,000 cps.

According to the embodiment of the present disclosure, functional particles are disposed in the second filling layer, wherein the functional particles include at least one of scattering particles, light-shielding particles, and heat-dissipating particles.

According to the embodiment of the present disclosure, the heat-dissipating particles include at least one of carbon particles and metallic nanoparticles.

According to the embodiment of the present disclosure, the light-shielding particles are made of a liquid crystal material.

In another aspect, an embodiment of the present disclosure provides a method for manufacturing the flexible substrate. The method includes: disposing a plurality of electronic components on the flexible base, a first gap being formed between each two adjacent electronic components of the plurality of electronic components; disposing a plurality of metal lines on the flexible base, and stretching and restoring the flexible base, such that the length of each metal line disposed in the first gap is greater than the width of the first gap in an extension direction of the metal line; and disposing a first filling layer in the first gap to wrap the metal line in the first gap.

According to the embodiment of the present disclosure, the step of disposing the plurality of metal lines on the flexible base, and stretching and restoring the flexible base, such that the length of each metal line disposed in the first gap is greater than the width of the first gap in the extension direction of the metal line, includes: stretching the flexible base provided with the plurality of electronic components; disposing a plurality of metal lines on the stretched flexible base, wherein at least a portion of the plurality of metal lines are disposed in the first gap, and two ends of each metal line disposed in the first gap are connected to the corresponding electronic component adjacent thereto; and restoring the flexible base to a size before stretching, such that the metal line forms protrusions on the flexible base.

According to the embodiment of the present disclosure, during arranging the first filling layer, the method further includes: controlling the height of the first filling layer, such that the first filling layer is lower than the electronic component corresponding to the first gap in a direction perpendicular to the flexible base, thereby forming a groove in the first gap; and the method further includes: disposing a protective cover on one side of the electronic component distal from the base, wherein the protective cover is attached to the electronic component by an adhesive layer, such that an air gap is formed at the groove.

According to the embodiment of the present disclosure, the method further includes: filling one side of the first filling layer distal from the base with a material having a Young's modulus greater than 0.1 MPa or a viscosity less than 10,000 cps to form a second filling layer; and disposing a protective cover on one side of the second filling layer distal from the base, wherein the protective cover is attached to the second filling layer and the electronic component by an adhesive layer.

In yet another aspect, an embodiment of the present disclosure further provides a flexible electronic device. The flexible electronic device includes the above-described flexible substrate.

BRIEF DESCRIPTION OF THE DRAWINGS

The above and/or other aspects and advantages of the present disclosure become apparent and readily understood in the description of the embodiments in conjunction with the following accompanying drawings. In the drawings:

FIG. 9 is a flowchart of a method for manufacturing the flexible substrate according to another embodiment of the present disclosure.

DETAILED DESCRIPTION

Figure 1:
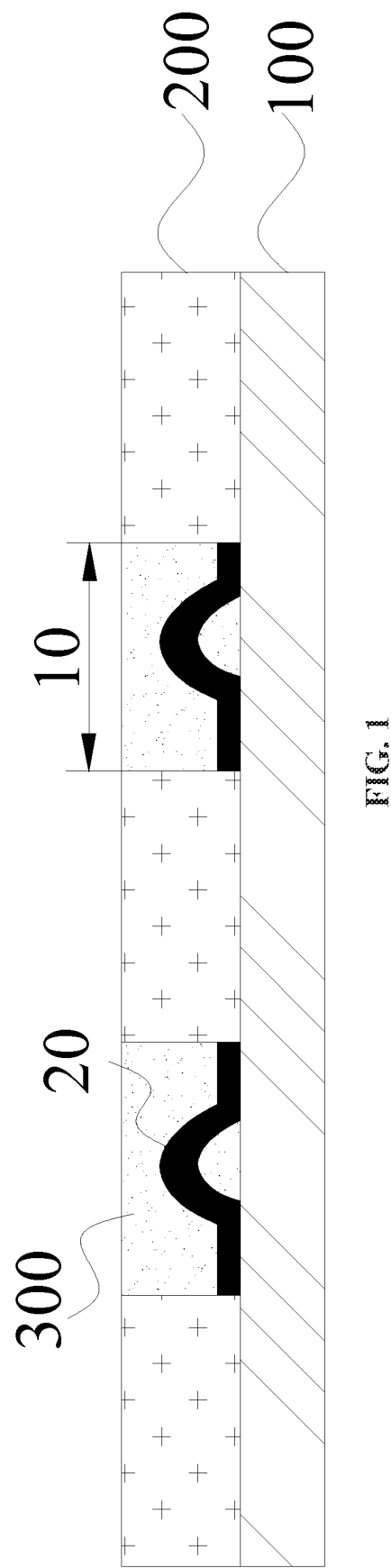
FIG. 1 is a schematic structural diagram of a flexible substrate according to an embodiment of the present disclosure.

The technical solutions of the embodiments of the present disclosure are described hereinafter clearly and completely with reference to the accompanying drawings in the embodiments of the present disclosure, to present the objects, technical solutions, and advantages of the embodiments of the present disclosure more clearly. It is apparent that the described embodiments are only some exemplary embodiments of the present disclosure, rather than all embodiments. According to the described exemplary embodiments of the present disclosure, all of the other embodiments obtained by a person skilled in the art without consuming any creative effort fall within the protection scope of the present disclosure.

Unless otherwise defined, technical terms or scientific terms used herein shall be taken to mean the ordinary meanings as understood by the ordinary skill in the art to which the present disclosure belongs. The terms "first", "second" and the like used in the description and claims of the present disclosure do not denote any order, quantity, or importance, but are merely used to distinguish different components. Similarly, the terms "a", "an" and "the", and the like are not intended to limit the number, but to denote the number of at least one. The terms "comprise", "include", and the like are intended to mean that the elements or objects before said term cover the elements or objects or equivalents listed after said term, without excluding other elements or objects. The terms "upper", "lower", and the like are only used to indicate the relative positional relationship, and when the absolute position of a described object changes, the relative positional relationship may also change accordingly.

The inventors have found that the current flexible electronic device still has the problems such as the need to improve the bendability, and the limited bending life of the device. After in-depth researches and a large number of experiments, the inventors have found that this is mainly because of the relatively poor bendability of metal lines in a flexible substrate. For example, the problems such as breakage or cracking that may occur during bending of the substrate may be reduced by, for example, removing brittle structures (e.g., inorganic functional layers that, for example, include various buffer layers, insulating layers, etc.) in a specific area of a flexible substrate. However, a connection line for connecting electronic components or connecting an electronic component and an external circuit (such as a control IC or the like) is generally less resistant to bending. This is because the connection line usually needs to be made of a metal in order to reduce the resistance of a device and ensure the transmission of electrical signals. Although the metal material has a slightly better ductility than a brittle inorganic material, of the flexible device still has a structure which is prone to damage during the bending process for the flexible device. Moreover, once an area where the metal lines are located is damaged, the overall performance of the flexible electronic device is still negatively affected even if semiconductor components are intact. Even if a metal line having a stretchable structure may be manufactured to provide a margin for subsequent bending, that is, the metal line forms protrusions or recesses on the flexible substrate, the metal line having the stretchable structure is liable to adhere to other structures above or below the metal line during the stretching or bending process of the flexible substrate, thereby damaging the metal line structure caused by friction or adhesion.

The embodiments of the present disclosure are directed to alleviate or solve at least one of the above problems to at least a certain extent.

In one aspect, an embodiment of the present disclosure provides a flexible substrate. Referring to FIG. 1, the flexible substrate includes a flexible base 100, and a plurality of electronic elements 200 and a plurality of metal lines 20 which are disposed on the flexible base 100. A first gap 10 may be formed between each two adjacent electronic components of the plurality of electronic components 200. At least one end of each metal line 20 is connected to the corresponding electronic component 200. For example, one end of each metal line 20 may be connected to the corresponding electronic component 200, while the other end of the metal line 20 is connected to an external circuit (not shown in FIG. 1). For another example, two ends of each metal line 20 may be connected to the electronic component 200 adjacent thereto, respectively. At least a portion of the plurality of metal lines 20 may be disposed in the first gap 10, and the length of each metal line 20 disposed in the first gap 10 is greater than the width of the first gap 10 in an extension direction of the metal line 20. That is, the metal line 20 forms protrusions or recesses in the first gap 10. Each metal line 20 in the first gap 10 is wrapped by a first filling layer 300.

According to the embodiment of the present disclosure, the metal line forms protrusions or recesses on the flexible substrate, which may provide a margin for the subsequent bending. In addition, the first filling layer is filled into the first gap in a manner of wrapping the metal line. Therefore, the metal line may be protected by the first filling layer to prevent the metal line from being damaged due to friction or adhesion with other structures during stretching.

Figure 2:
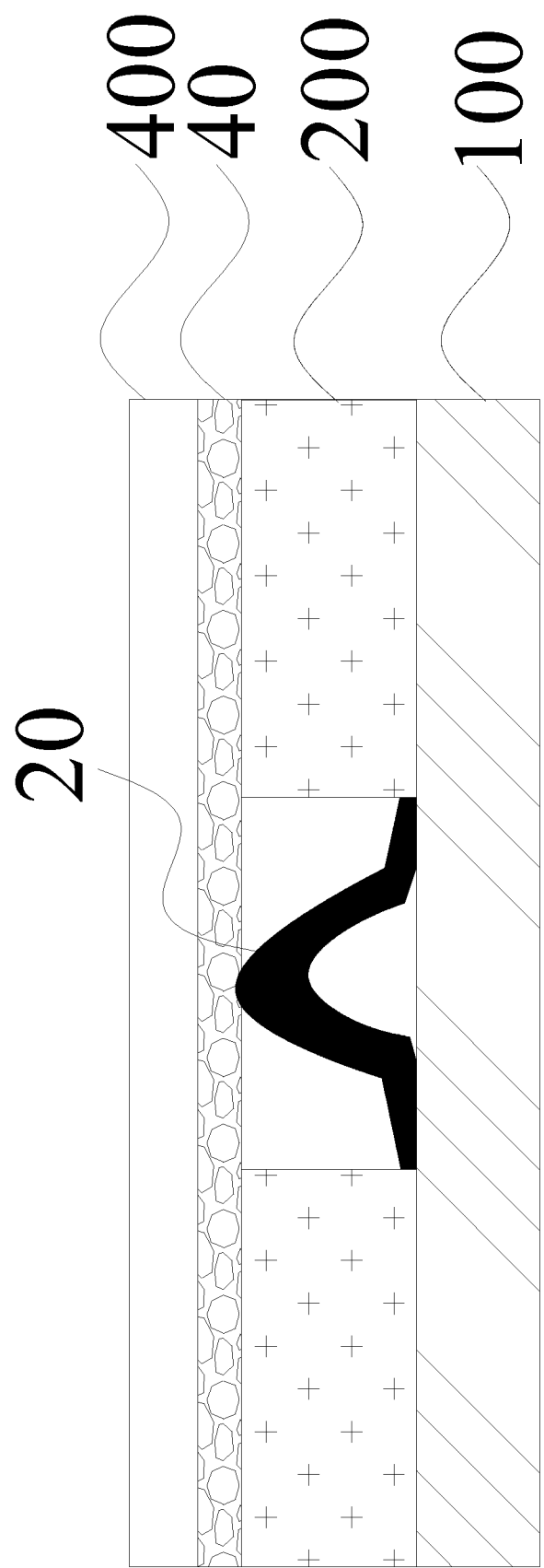
FIG. 2 and FIG. 3 are schematic structural diagrams when the flexible substrate that is not provided with a first filling layer is stretched and compressed.
Figure 3:
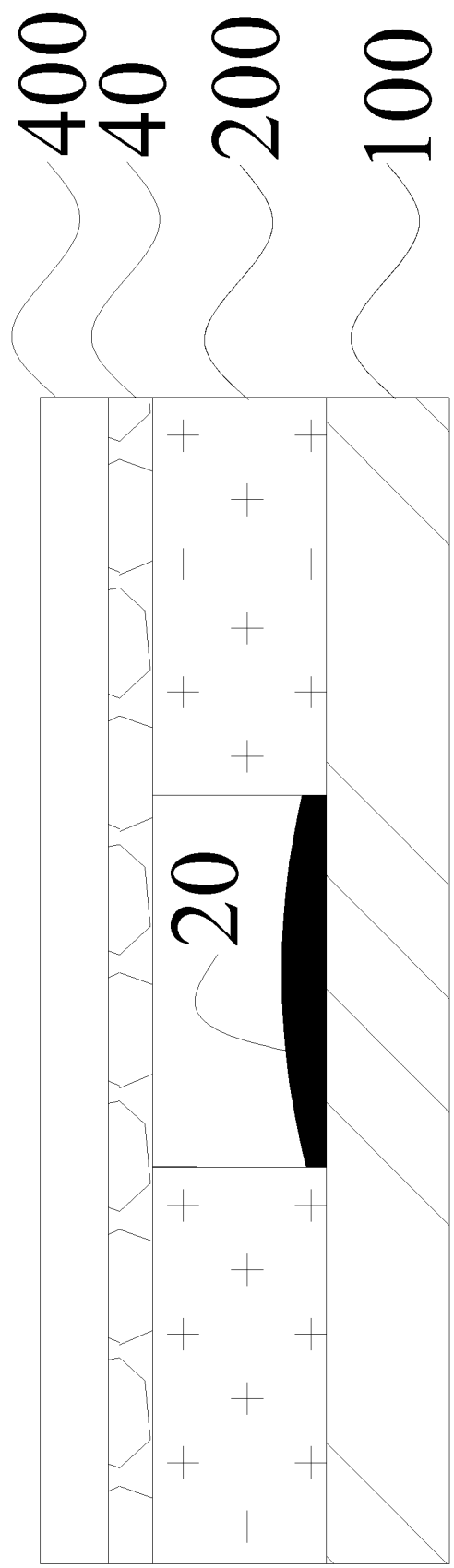

Referring to FIG. 2 and FIG. 3, in the absence of the first filling layer, when the flexible base 100 is compressed (referring to FIG. 2) or stretched (referring to FIG. 3), even the metal line 20 having the protrusion structure will still inevitably come into contact with a film layer above the metal line 20 (for example, an adhesive layer 40 for bonding a protective cover 400 as shown in FIG. 2) or the flexible base 100 below the metal line 20 (refer to FIG. 3). The metal line 20 having the recession structure also come into contact with structures such as the adhesive layer 40 and the flexible base 100 during the stretching or compression process, and will not be described in detail herein. Regardless of the adhesive layer 40 or the flexible base 100 commonly used in the flexible substrate, it may cause the damage to the metal line 20 while contacting the metal line 20 or moving relative to the metal line 20 (such as during the rebound process of the flexible substrate). Therefore, even if the metal line 20 is configured to have certain protrusions or recesses (i.e., the metal line having a stretchable structure is formed), it may not be ensured that the metal line is free of damage when the flexible base 100 deforms.

The respective structures of the flexible substrate are exemplarily described hereinafter with reference to some exemplary embodiments of the present disclosure. However, a person skilled in the art may appreciate that the present disclosure is not limited to the following exemplary embodiments described.

The inventors have found that when the first filling layer 300 is made of a low-rigidity material, for example, when low-rigidity glue (water gel) or an incompressible fluid (such as grease) is used to form the first filling layer 300, during the above compression or stretching process of the flexible base 100, the first filling layer 300 may be deformed simultaneously with the metal line 20 wrapped therein. Therefore, there is no relative movement between the first filling layer 300 and the metal line 20. That is, the damage to the metal lines 20 caused by the friction or adhesion of the metal lines 20 with the surrounding structures may be alleviated or avoided. According to the embodiment of the present disclosure, the low-rigidity first filling layer is used to wrap the metal line from both the upper and lower sides to prevent the metal line from being damaged due to the friction with other structures during stretching.

According to some embodiments of the present disclosure, a material of the first filling layer 300 may include a water gel having a Young's modulus of being less than 0.1 Mpa. The first filling layer made of the material satisfying this condition has better flexibility, and may alleviate the problem that the metal lines are damaged by pulling the metal lines during the stretching or bending of the flexible base.

Alternatively, according to some other embodiments of the present disclosure, the material of the first filling layer 300 may further include a viscoelastic body, for example, a polymer material having a viscosity of being less than 10,000 cps. When the first filling layer is made of the viscoelastic body, the Young's modulus may not accurately measure the performances of the material of such type. Therefore, the first filling layer 300 may be formed of a viscoelastic body material having a viscosity of being less than 10,000 cps. The first filling layer made of the material satisfying this condition has better flexibility, and may alleviate the problem that the metal lines are damaged by pulling the metal lines during the stretching or bending of the flexible base.

The arrangement manner of the plurality of electronic components 200 disposed on the flexible base 100, as well as the specific structures, types and connection relationships of the electronic components 200 and the metal lines 20 will not be specifically limited in the embodiments of the present disclosure. For example, according to some embodiments of the present disclosure, the electronic components 200 may be a plurality of flexible packages arranged in an array. For example, the electronic components 200 may be organic light-emitting device packages which are arrayed on the flexible base 100. Each metal line 20 may be a metal line for connecting adjacent electronic components 200, or may also be a metal wire for connecting the electronic component 200 and an external circuit (such as a control IC).

It may be understood by a person skilled in the art that, in the case of a flexible substrate for a flexible display device, in practical use, the flexible substrate located in a display area always tends to have a relatively large degree of bending (a curvature of bending is relatively large). Therefore, metal (the metal lines 20) at this position for connecting a plurality of light-emitting elements (such as the above-described electronic components 200) is most susceptible to damage during bending, stretching, and compression. Therefore, each metal line 20 for connecting the plurality of electronic components 200 in the display area is configured as a wavy structure having protrusions or recesses, and is wrapped by the first filling layer 300, which is advantageous for greatly improving the performances of the flexible substrate.

Similarly, in a flexible substrate for other types of flexible devices, the metal line 20 in an area having the largest deformation on the flexible base is wrapped by using the first filling layer 300, which is also advantageous for prolonging the service life and improving the flexibility of the flexible substrate. Nevertheless, it may be understood by a person skilled in the art that, in practical applications, the metal lines 20 (such as a metal wire for connecting a control IC) in other areas (such as areas other than the display area of the flexible display substrate), each having a relatively small deformation, of the flexible substrate may be configured to have a shape of the above-described wavy structure, and are wrapped by the first filling layer 300, as needed.

According to the embodiment of the present disclosure, each metal line may have protrusions in a direction perpendicular to the flexible base 100, and the first filling layer may be higher than the protrusions of the metal line. Therefore, the protrusions may be utilized to form a stretchable structure that provides a margin for stretching or bending of the metal line as the flexible substrate is bent or stretched. The first filling layer 300 is filled in the first gap between the electronic components 200 in such a manner of wrapping the metal line 20. That is, the metal line 20 is covered by the first filling layer 300 on one side distal from the flexible base and one side facing the flexible base 100. Therefore, the metal lines 20 may be prevented from rubbing with other structures when the flexible substrate is stretched, compressed or bent, or subject to other deformations. That is, in the flexible substrate according to the embodiment of the present disclosure, the metal line 20 is wrapped by the first filling layer 300 therein.

According to the embodiment of the present disclosure, the first filling layer 300 is disposed on one side of the metal line 20 facing the flexible base 100 and one side of the metal line 20 distal from the flexible base 100, respectively. Therefore, the metal line 20 may be wrapped from both the upper and lower sides by the low-rigidity first filling layer 300 to prevent the metal line 20 from being damaged by friction with other structures during stretching.

Figure 4:
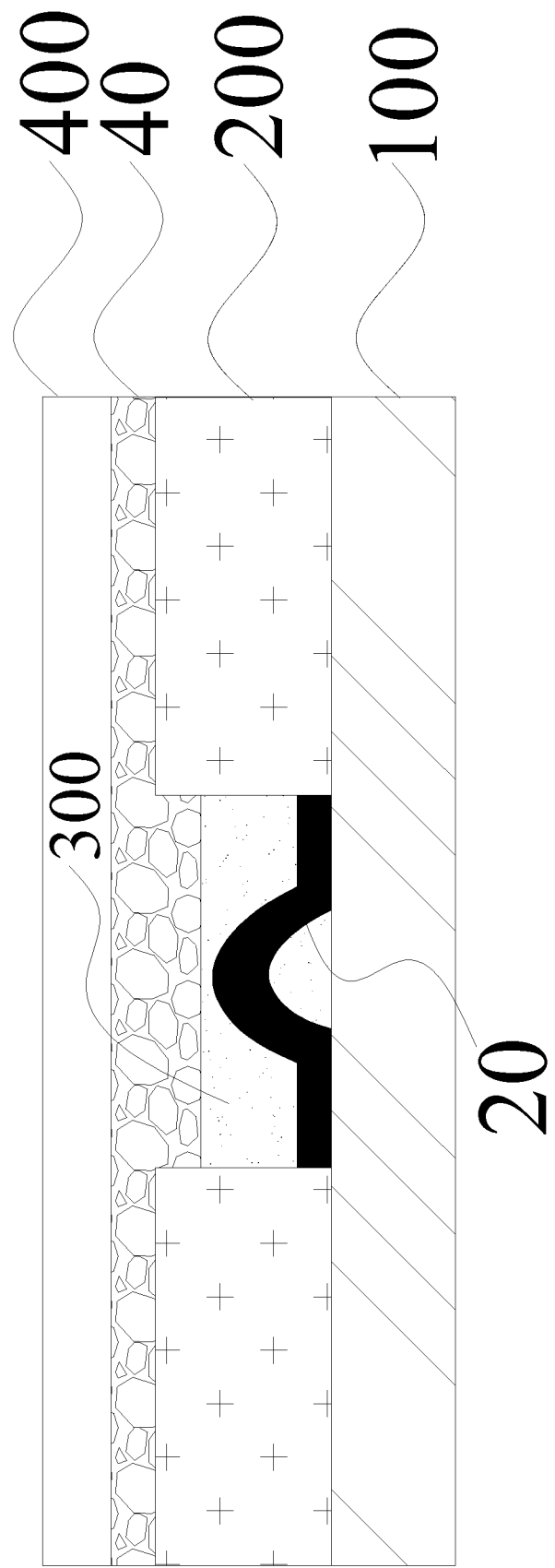
FIG. 4 is a schematic structural diagram of a flexible substrate according to an embodiment of the present disclosure.

According to the embodiment of the present disclosure, in order to further improve the performances of the flexible substrate, referring to FIG. 4, the flexible substrate may further include a protective cover 400. The protective cover 400 may be disposed on one side of the electronic component 200 distal from the flexible base 100 to provide protection for the electronic component. The protective cover 400 may be fixed to the electronic component 200 by an adhesive layer 40. The specific composition of the adhesive layer 40 will not be limited in the embodiment of the present disclosure. A person skilled in the art may select an appropriate material known in the art to form the adhesive layer 40 according to actual conditions.

As previously mentioned, since the metal line 20 is wrapped by the first filling layer, the adhesive layer 40 may not come into direct contact with the metal line 20. Therefore, the adhesive layer 40 may be formed of a conventional material without worrying about damaging the metal line 20 due to the excessive rigidity of the adhesive layer 40. For example, the adhesive layer 40 may be formed by using water gel having a Young's modulus of more than 0.1 Mpa. Moreover, the specific shape of the adhesive layer 40 will not be limited in the embodiment of the present disclosure. For example, the surface of the electronic component 200 distal from one side of the flexible base 100 may be slightly higher than the surface of the first filling layer 300 distal from one side of the flexible base 100. Correspondingly, the adhesive layer 40 may have a partially protruding uneven structure as shown in FIG. 4 to fill a step between the upper surface of the first filling layer 300 and the upper surface of the electronic component 200.

Figure 5:
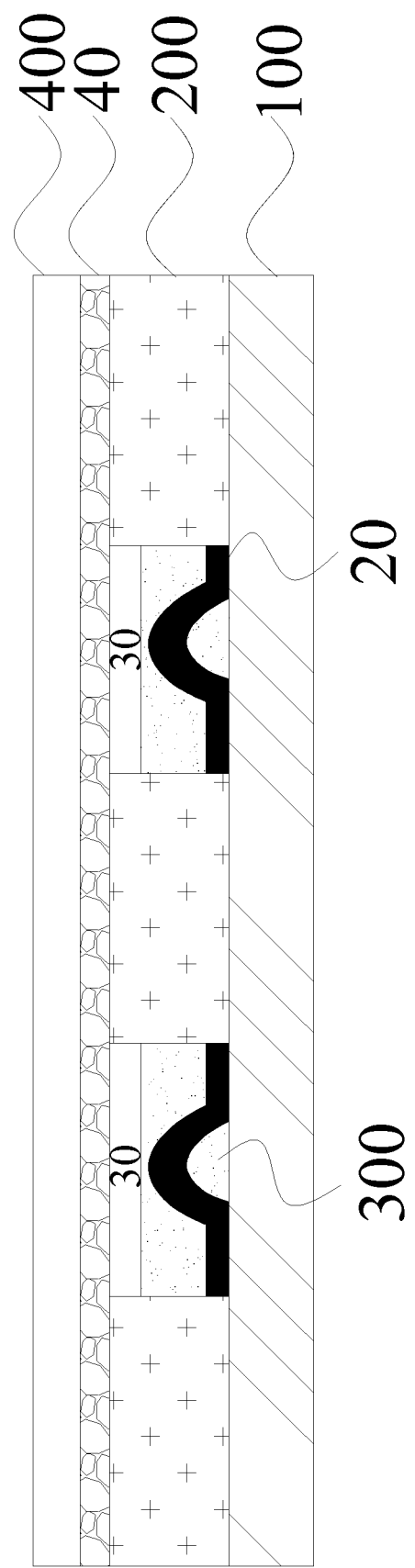
FIG. 5 is a schematic structural diagram of a flexible substrate according to another embodiment of the present disclosure.

According to further embodiments of the present disclosure, referring to FIG. 5, the adhesive layer 40 may also be of a flat layered structure. For example, the first filling layer 300 may be lower than the electronic component 200 in a direction perpendicular to the flexible base 100. Therefore, a second gap 30 may be formed between the adhesive layer 40 and the first filling layer 300, wherein the second gap 30 is filled with air. Therefore, when a deformation occurs, the second gap 30 formed by the air may be used to provide a deformed buffer space for the entire flexible substrate, such that the bendability of the flexible substrate may be further improved.

Figure 6:
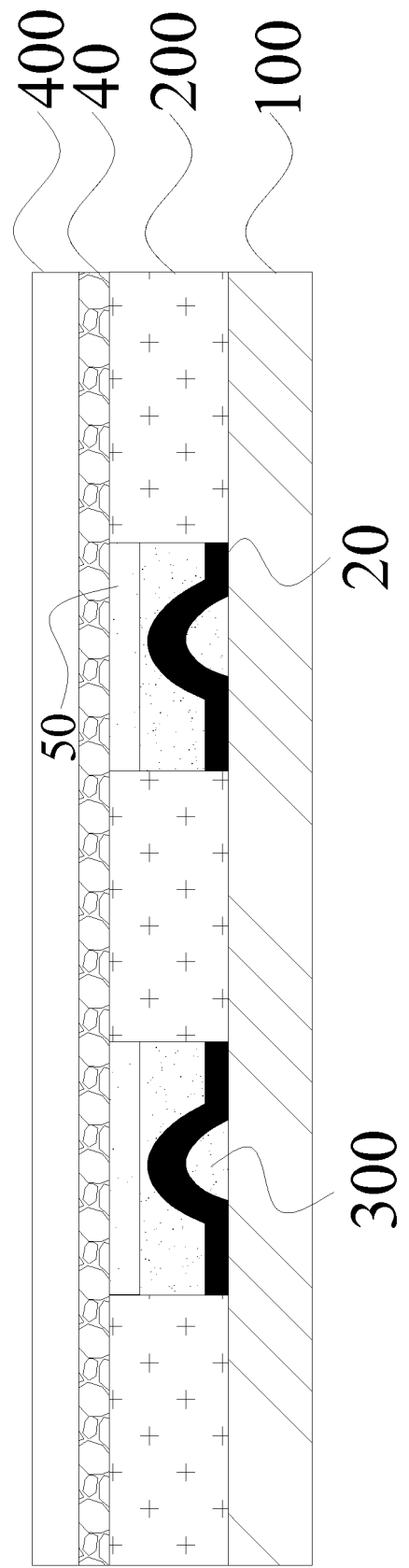
FIG. 6 is a schematic structural diagram of a flexible substrate according to yet another embodiment of the present disclosure.

According to still other embodiments of the present disclosure, referring to FIG. 6, the second gap 30 may also be filled with a second filling layer 50, rather than air. For example, the second filling layer 50 may be made of a material having a Young's modulus of being less than 0.1 Mpa or a viscosity of being less than 10,000 cps. Therefore, the bendability of the flexible substrate may be further improved.

Figure 7:
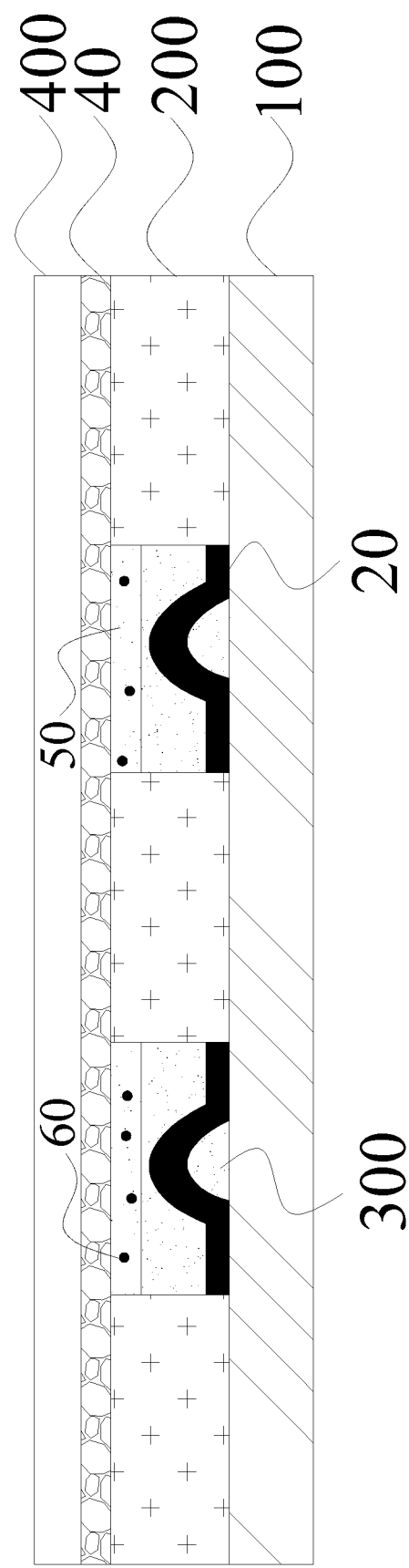
FIG. 7 is a schematic structural diagram of a flexible substrate according to a further embodiment of the present disclosure.

According to some embodiments of the present disclosure, referring to FIG. 7, the second filling layer 50 may be filled with functional particles 60 to meet different functional requirements. For example, the functional particles 60 may include at least one of scattering particles, light-shielding particles, and heat-dissipating particles. Therefore, the performances of the flexible substrate may be further improved.

For example, the functional particles 60 may include heat-dissipating particles that may improve the overall heat dissipation function of the flexible substrate to allow the electronic components to be used for a long time, such as particles having a heat dissipation function, or carbon particles or metallic nano-particles made of a carbon material or a metal material. For example, the particles having the heat dissipation function may be directly doped in water gel or liquid for forming the second filling layer 50.

Alternatively, the functional particles 60 may also be particles having certain optical properties, such as dyes or particles having light-shielding properties, to provide an anti-penetration or anti-reflection function when the flexible substrate is stretched, thereby blocking reflected light of the metal lines 20 below the second filling layer 50.

Alternatively, the functional particles 60 may also be scattering particles formed of a material having a light scattering function, such that the light output of the deformed flexible substrate is more uniform. According to some embodiments of the present disclosure, particles having a particle size of from 0.3 to 1 μm may be employed. Alternatively, functional particles formed of a liquid crystal material may also be employed. The liquid crystal material may control the light transmission at the second filling layer 50 by changing an electromagnetic field. Alternatively, the functional particles may also include one or a combination of more of the foregoing particles.

In another aspect, based on the same inventive concept, an embodiment of the present disclosure also provides a method for manufacturing a flexible substrate. According to the embodiment of the present disclosure, the flexible substrate manufactured by the method may have the same characteristics and advantages as the flexible substrate described above.

Figure 8:
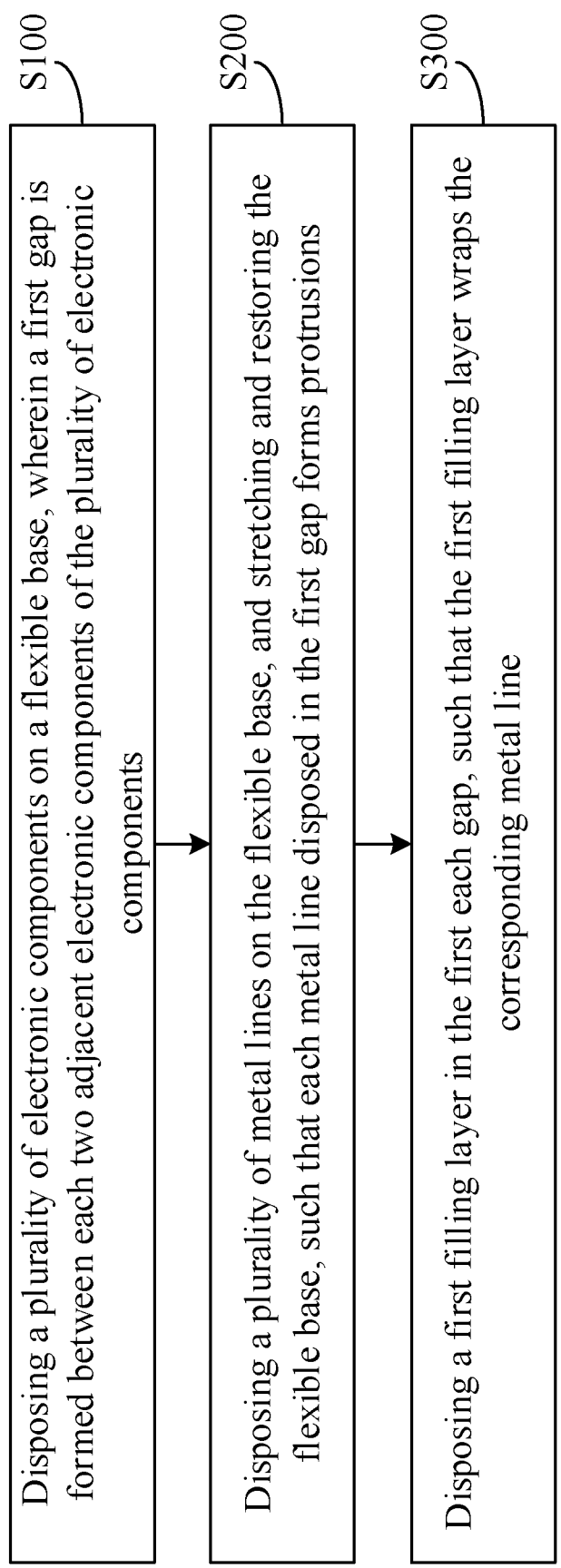
FIG. 8 is a flowchart of a method for manufacturing the flexible substrate according to an embodiment of the present disclosure.

In an embodiment of the present disclosure, referring to FIG. 8, the method may include the following steps.

In S100, a plurality of electronic components are disposed on a flexible base, and a first gap is formed between each two adjacent electronic components of the plurality of electronic components.

According to the embodiment of the present disclosure, in this step, the plurality of electronic components are disposed on the flexible base, and a first gap is formed between each two adjacent electronic components of the plurality of electronic components. In the embodiment of the present disclosure, the type and number of the electronic components provided in the step and the arrangement manner of the plurality of electronic components may not be limited, and may be selected by a person skilled in the art according to actual conditions. For example, in accordance with some embodiments of the present disclosure, the electronic components in this step may have the same features and advantages as the electronic components in the flexible substrate described above, and are not described herein.

In S200, a plurality of metal lines are disposed on the flexible base, and the flexible base is stretched and restored, such that each metal line disposed in the first gap forms protrusions.

According to the embodiment of the present disclosure, the metal line having the protrusions may be disposed in the first gap between adjacent electronic components, and two ends of each metal line are connected to the adjacent electronic components and then fixed. In addition, the flexible base may be stretched before the metal lines are disposed, and may be restored to an original size after the metal lines are fixed, such that the length of each metal line disposed in the first gap is greater than the length of the first gap in an extension direction of the metal line. That is, the metal line disposed in the first gap forms protrusions.

According to an embodiment of the present disclosure, referring to FIG. 9, the setting for the metal lines may be implemented by the following steps: first, stretching the flexible base provided with the plurality of electronic components; subsequently, referring to (a) in FIG. 9, disposing the metal lines on the stretched flexible base, and fixing two ends of each metal line, for example, connecting two ends of the metal line to the electronic component 200 adjacent thereto, wherein each metal line in this case is of a flat structure disposed on the flexible base 100, but does not completely adhere to the flexible base 100; and finally, referring to (b) in FIG. 9, causing each metal line 20 to form protrusions 21 on the flexible base 100 by compressing and restoring the flexible base to a size before stretching. Therefore, the plurality of metal lines may be readily formed on the flexible substrate as a whole to form a stereoscopic wavy structure, so as to provide a margin for deformation of the metal lines when the flexible substrate is bent or stretched.

In S300, a first filling layer is disposed in the first gap, such that the first filling layer wraps the corresponding metal line.

According to the embodiment of the present disclosure, the first filling layer is disposed in this step, such that the first filling layer wraps the metal line. Therefore, a flexible substrate having a better tensile property and a long life may be readily obtained. According to the embodiment of the present disclosure, the first filling layer formed in this step may have the same features and advantages as the first filling layer 300 previously described with reference to FIG. 1, and FIG. 5 to FIG. 7, which is not described herein.

For example, in this step, water gel or other liquid which is subjected to pressure defoaming and used to form the first filling layer may be filled in the first gap between the plurality of electronic components. After the subsequent drying, the first filling layer wrapping the metal line may be formed. The first filling layer may avoid or reduce the interference (adhesion or friction) with other structures when the metal line is deformed. The materials for forming the first filling layer have been described in detail above, and are not described herein.

According to the embodiment of the present disclosure, the method may further include a step of providing a protective cover. For example, the protective cover may be disposed on one side of the electronic component distal from the flexible base to better provide protection for the electronic component. The protective cover may be fixed to the electronic component by an adhesive layer, for example, attached to the electronic component.

In the embodiment of the present disclosure, the specific composition of the adhesive layer for fixing the protective cover is not limited, and a person skilled in the art may select a familiar material to form the adhesive layer according to actual conditions. As mentioned above, since the metal line is wrapped by the first filling layer, the adhesive layer may not come into direct contact with the metal line, without the need to worry that the metal line is damaged due to the excessive rigidity of the adhesive layer. For example, the adhesive layer 40 may be formed by using water gel having a Young's modulus of more than 0.1 MPa. Moreover, the specific shape of the adhesive layer will not be limited in the embodiment of the present disclosure. For example, the adhesive layer 40 may have a partially protruding, uneven structure as shown in FIG. 4 to fill a step between the upper surface of the first filling layer 300 and the upper surface of the electronic component 200.

According to further embodiments of the present disclosure, the adhesive layer for fixing the protective cover may also be of a flat layered structure. In the embodiment, in step S300, the height of the first filling layer may be controlled, such that the first filling layer is lower than the electronic component in a direction perpendicular to the flexible base, thereby forming a groove in the first gap. In this case, when the protective cover is provided, the protective cover is attached to the electronic component by using the adhesive layer, and an air gap is formed at the groove. The structure of the flexible substrate formed by the present embodiment, as shown in FIG. 5, may be referenced to the detailed description of FIG. 5, and is not described herein. Therefore, as described above, when the deformation occurs, the second gap 30 formed by air may provide a buffer space for deformation of the entire flexible substrate, such that the bendability of the flexible substrate may be further improved.

Alternatively, according to further embodiments of the present disclosure, the second gap between the protective cover and the first filling layer may not be an air gap but filled with a second filling layer. For example, referring to (c) in FIG. 9, the second filling layer 50 may be made of a material having a Young's modulus of being less than 0.1 MPa. The second filling layer 50 formed in this step may have the same features and advantages as the second filling layer in the flexible substrate described above, and will not be described herein. For example, functional particles may also be mixed in a material for forming the second filling layer 50 in advance to form a second filling layer 50 (not shown) including the functional particles. Therefore, the performance of the flexible substrate manufactured by the method may be further improved. The types, sizes, characteristics, specific functions and advantages of the functional particles may be referenced to the related description of the functional particles 60 in the flexible substrate described above, and are not described herein.

According to the embodiment of the present disclosure, referring to (d) in FIG. 9, after the second filling layer 50 is formed, the protective cover 400 may be fixed to one side of the flexible base 100 facing the metal line 20 by the adhesive layer 40. Therefore, the flexible substrate having better flexibility and a long service life may be readily obtained.

Figure 10:
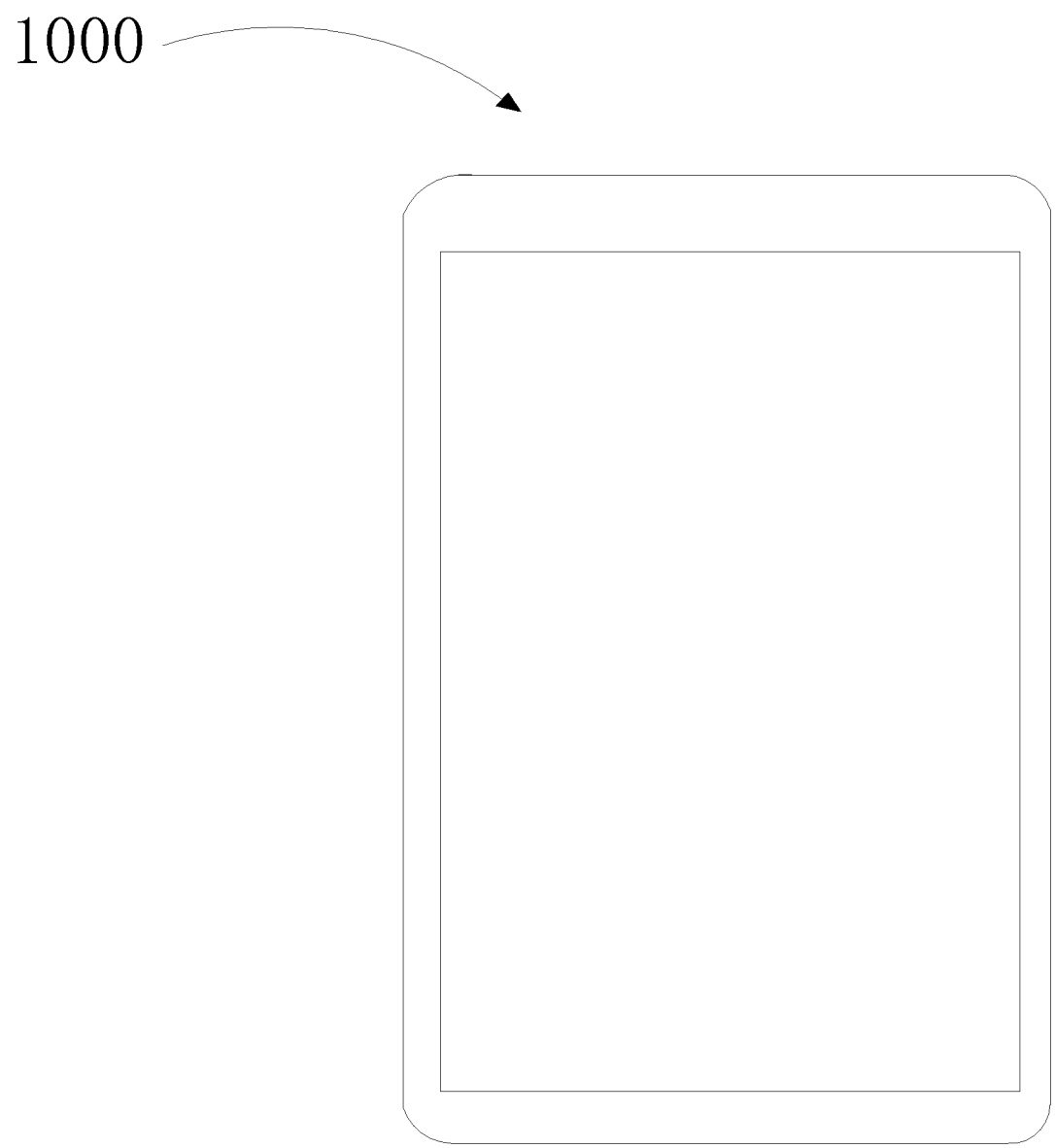
FIG. 10 is a schematic structural diagram of a flexible electronic device according to an embodiment of the present disclosure.

In yet another aspect, based on the same inventive concept, an embodiment of the present disclosure also provides a flexible electronic device, as shown in FIG. 10. According to the embodiment of the present disclosure, the flexible electronic device includes the flexible substrate as described above. Correspondingly, the flexible electronic device has all the features and advantages of the flexible substrate described above, which are not described herein. For example, in accordance with some embodiments of the present disclosure, the flexible electronic device may be a flexible display device.

In the description of the present description, the description of referring terms such as "an embodiment" and "another embodiment" integrates particular features, structures, materials or characteristics described in combination of the embodiments and included in at least one embodiment of the present disclosure. In the present description, schematic description of the above terms does not necessarily refer to the same embodiment or example. Furthermore, the described particular features, structures, materials or characteristics may be integrated with any one or more embodiments or examples in a proper manner. In addition, various embodiments or examples described in the present description, as well as features of various embodiments or examples, may be integrated and combined without contradicting each other. In addition, it should be noted that in the present description, the terms "first" and "second" are used for descriptive purposes only, and are not to be construed as indicating or implying a relative importance or implicitly indicating the number of technical features indicated.

The above description is only the specific embodiments of the present disclosure, but the protection scope of the present disclosure is not limited thereto. Any changes or replacements readily conceivable by a person skilled in the art within the technical scope of the present disclosure should be included within the protection scope of the present disclosure. Therefore, the protection scope of the present disclosure should be subjected to the protection scope of the claims.

What is claimed is:

1. A flexible substrate, comprising:
a flexible base;
a plurality of electronic components disposed on the flexible base, a first gap being between each two adjacent electronic components of the plurality of electronic components; and
a plurality of metal lines, wherein at least one end of each of the metal lines is connected to the corresponding electronic component, at least a portion of the plurality of metal lines are disposed in the first gap, and a length of each metal line disposed in the first gap is greater than a width of the first gap in an extension direction of the metal line;
wherein a first filling layer is disposed in the first gap to wrap the metal line disposed in the first gap; and
the flexible substrate further comprises a protective cover, the protective cover is disposed on one side of the electronic component distal from the flexible base by an adhesive layer, and a second gap is between the first filling layer and the adhesive layer.

2. The flexible substrate according to claim 1, wherein a material of the first filling layer comprises a water gel having a Young's modulus of being less than 0.1 MPa.

3. The flexible substrate according to claim 1, wherein a material of the first filling layer comprises a polymer material having a viscosity of being less than 10,000 cps.

4. The flexible substrate according to claim 1, wherein the plurality of electronic components are a plurality of flexible packages arranged in an array, and two ends of each of the metal lines are connected to the corresponding electronic component adjacent thereto.

5. The flexible substrate according to claim 1, wherein each metal line has protrusions in a direction perpendicular to the flexible base.

6. The flexible substrate according to claim 1, wherein the second gap is an air gap.

7. The flexible substrate according to claim 1, wherein a second filling layer is disposed in the second gap.

8. The flexible substrate according to claim 7, wherein functional particles are disposed in the second filling layer, wherein the functional particles comprise at least one of scattering particles, light-shielding particles, and heat-dissipating particles.

9. The flexible substrate according to claim 8, wherein the heat-dissipating particles comprise at least one of carbon particles or metallic nanoparticles.

10. The flexible substrate according to claim 8, wherein the light-shielding particles are made of a liquid crystal material.

11. The flexible substrate according to claim 7, wherein a material of the second filling layer comprises a material having a Young's modulus of being less than 0.1 Mpa or having a viscosity of being less than 10,000 cps.

12. The flexible substrate according to claim 11, wherein the material of the first filling layer comprises at least one of: a water gel having a Young's modulus of being less than 0.1 Mpa, and a polymer material having a viscosity of less than 10,000 cps;
the plurality of electronic components are a plurality of flexible packages arranged in an array, two ends of each of the metal lines are connected to the corresponding electronic component adjacent thereto, and each metal line has protrusions in a direction perpendicular to the flexible base; and
functional particles are disposed in the second filling layer, wherein the functional particles comprise at least one of scattering particles, light-shielding particles, and heat-dissipating particles;
wherein the heat-dissipating particles comprise at least one of carbon particles or metallic nanoparticles, and the light-shielding particles are made of a liquid crystal material.

13. A flexible electronic device, comprising a flexible substrate; wherein the flexible substrate comprises:
a flexible base;
a plurality of electronic components disposed on the flexible base, a first gap being formed between each two adjacent electronic components of the plurality of electronic components; and
a plurality of metal lines, wherein at least one end of each of the metal lines is connected to the corresponding electronic component, at least a portion of the plurality of metal lines are disposed in the first gap, and a length of each metal line disposed in the first gap is greater than a width of the first gap in an extension direction of the metal line;
wherein a first filling layer is disposed in the first gap to wrap the metal line disposed in the first gap; and
the flexible substrate further comprises a protective cover, the protective cover is disposed on one side of the electronic component distal from the flexible base by an adhesive layer, and a second gap is between the first filling layer and the adhesive layer.

14. The flexible electronic device according to claim 13, wherein a second filling layer is disposed in the second gap, wherein a material of the second filling layer comprises a material having a Young's modulus of being less than 0.1 Mpa or having a viscosity of being less than 10,000 cps.

15. The flexible electronic device according to claim 14, wherein a material of the first filling layer comprises at least one of: a water gel having a Young's modulus of being less than 0.1 Mpa, and a polymer material having a viscosity of less than 10,000 cps;
the plurality of electronic components are a plurality of flexible packages arranged in an array, two ends of each of the metal lines are connected to the corresponding electronic component adjacent thereto, and each metal line has protrusions in a direction perpendicular to the flexible base; and
functional particles are disposed in the second filling layer, wherein the functional particles comprise at least one of scattering particles, light-shielding particles, and heat-dissipating particles;

wherein the heat-dissipating particles comprise at least one of carbon particles or metallic nanoparticles, and the light-shielding particles are made of a liquid crystal material.

16. A method for manufacturing a flexible substrate, comprising:
   disposing a plurality of electronic components on the flexible base, a first gap being formed between each two adjacent electronic components of the plurality of electronic components;
   disposing a plurality of metal lines on the flexible base, and stretching and restoring the flexible base, such that the length of each metal line disposed in the first gap is greater than the width of the first gap in an extension direction of the metal line;
   disposing a first filling layer in the first gap to wrap the metal line in the first gap;
   controlling a height of the first filling layer, such that the first filling layer is lower than the electronic component corresponding to the first gap in a direction perpendicular to the flexible base, such that a groove is formed in the first gap; and
   disposing a protective cover on one side of the electronic component distal from the base, wherein the protective cover is attached to the electronic component by an adhesive layer, such that a second gap is formed at the groove.

17. The method according to claim 16, wherein the step of disposing the plurality of metal lines on the flexible base, and stretching and restoring the flexible base, such that the length of each metal line disposed in the first gap is greater than the width of the first gap in the extension direction of the metal line, comprises:
   stretching the flexible base provided with the plurality of electronic components;
   disposing a plurality of metal lines on the stretched flexible base, wherein at least a portion of the plurality of metal lines are disposed in the first gap, and two ends of each metal line disposed in the first gap are connected to the corresponding electronic component adjacent thereto; and
   restoring the flexible base to a size before stretching, such that the metal line forms protrusions on the flexible base.

18. The method according to claim 16, further comprising:
   forming a second filling layer on a side of the first filling layer distal from the base; and
   disposing a protective cover on one side of the second filling layer distal from the base, wherein the protective cover is attached to the second filling layer and the electronic component by an adhesive layer.

19. The method according to claim 18, wherein the forming a second filling layer on a side of the first filling layer distal from the base comprises:
   filling one side of the first filling layer distal from the base with a material having a Young's modulus of being greater than 0.1 Mpa or a viscosity of being less than 10,000 cps to form the second filling layer.

20. The method according to claim 18, further comprising: mixing functional particles in the material for forming the second filling layer, wherein the functional particles comprise at least one of scattering particles, light-shielding particles, and heat-dissipating particles.

* * * * *